(12) United States Patent
Ye et al.

(10) Patent No.: US 11,578,594 B2
(45) Date of Patent: Feb. 14, 2023

(54) ANALYZING AVERAGE SPECIFIC GRAVITY OF SOLIDS IN DRILLING FLUIDS

(71) Applicant: Halliburton Energy Services, Inc., Houston, TX (US)

(72) Inventors: Xiangnan Ye, Cypress, TX (US); Dale E. Jamison, Humble, TX (US); Li Gao, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 289 days.

(21) Appl. No.: 16/651,636

(22) PCT Filed: Dec. 21, 2017

(86) PCT No.: PCT/US2017/067999
§ 371 (c)(1),
(2) Date: Mar. 27, 2020

(87) PCT Pub. No.: WO2019/125477
PCT Pub. Date: Jun. 27, 2019

(65) Prior Publication Data
US 2020/0308964 A1    Oct. 1, 2020

(51) Int. Cl.
*G01R 27/16*    (2006.01)
*E21B 49/08*    (2006.01)
*G01N 27/02*    (2006.01)

(52) U.S. Cl.
CPC ....... *E21B 49/0875* (2020.05); *G01N 27/026* (2013.01); *G01N 27/028* (2013.01); *G01R 27/16* (2013.01)

(58) Field of Classification Search
CPC .............. G01N 27/028; G01N 27/026; G01N 33/2823; E21B 21/062; E21B 49/0875; G01R 27/16
See application file for complete search history.

(56) References Cited

U.S. PATENT DOCUMENTS

| 2005/0030034 | A1 | 2/2005 | Ganesan |
| 2006/0214671 | A1* | 9/2006 | Wooton ............... G01N 27/026 324/698 |
| 2009/0173150 | A1 | 7/2009 | DiFoggio et al. |
| 2014/0060819 | A1* | 3/2014 | Pindiprolu ........... G01N 27/026 166/250.01 |
| 2015/0211350 | A1* | 7/2015 | Norman ................. E21B 47/10 702/9 |
| 2017/0045432 | A1 | 2/2017 | Moth |
| 2017/0254735 | A1 | 9/2017 | Shen et al. |
| 2019/0119999 | A1* | 4/2019 | Kleinguetl ......... G01N 33/2823 |

(Continued)

FOREIGN PATENT DOCUMENTS

| WO | 2010107685 | 9/2010 |
| WO | 2014035551 | 3/2014 |
| WO | 2014035552 | 3/2014 |

OTHER PUBLICATIONS

ISRWO International Search Report and Written Opinion for PCT/US2017/067999 dated Sep. 10, 2018.

(Continued)

*Primary Examiner* — Alesa Allgood
(74) *Attorney, Agent, or Firm* — Thomas Rooney; C. Tumey Law Group PLLC

(57) ABSTRACT

Systems and methods for determining the composition of a drilling fluid using electro-rheology.

20 Claims, 9 Drawing Sheets

(56) References Cited

U.S. PATENT DOCUMENTS

| | | |
|---|---|---|
| 2019/0227048 A1 | 7/2019 | Ye et al. |
| 2019/0242203 A1 | 8/2019 | Kleinguetl et al. |
| 2019/0309613 A1 | 10/2019 | Jamison et al. |
| 2019/0360286 A1 | 11/2019 | Ye et al. |

OTHER PUBLICATIONS

Great Britain Office Action for Application No. GB2006755.9 dated Feb. 17, 2022.

* cited by examiner

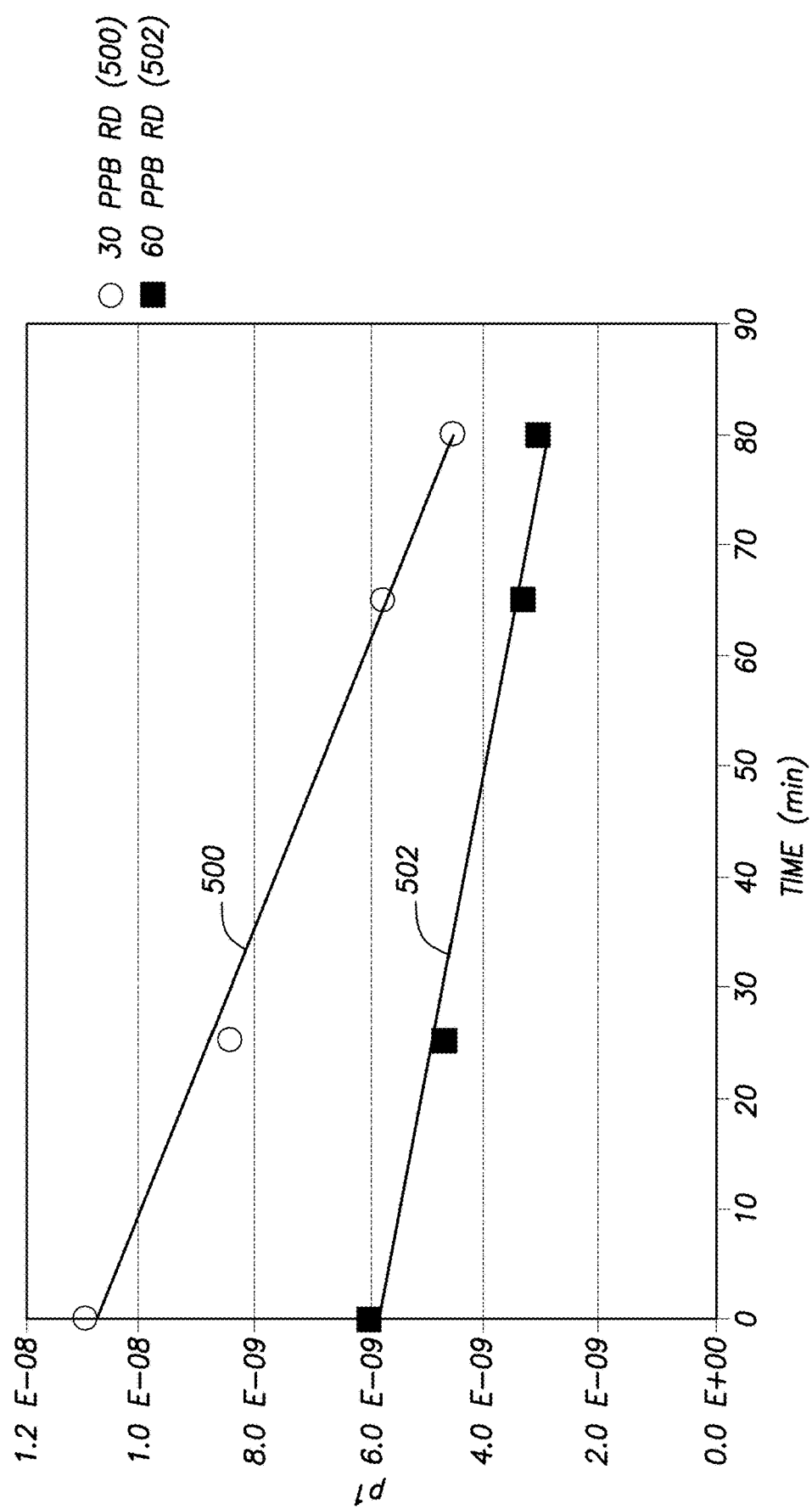

ANALYZING AVERAGE SPECIFIC GRAVITY OF SOLIDS IN DRILLING FLUIDS

BACKGROUND

During the drilling of a wellbore into a subterranean formation, a drilling fluid, also referred to as a drilling mud, may be continuously circulated from the well surface down to the bottom of the wellbore being drilled and back to the well surface again. The drilling fluid may include a mixture of water, oil, additives (e.g., viscosifiers, weighting materials, emulsifying surfactants, and the like), and combinations thereof, to impart certain properties to the drilling fluid to satisfy different drilling requirements.

The drilling fluid can serve several functions, one of them being to transport wellbore cuttings up to the surface where they are separated from the drilling fluid. Another function of the drilling fluid can include providing hydrostatic pressure against the wall of the drilled wellbore, thereby preventing wellbore collapse and the resulting influx of gas or liquid from the formations being penetrated. The density of the drilling fluid may be maintained, for example, to control the hydrostatic pressure that the drilling exerts at the bottom of the wellbore. It may be desired to monitor properties of the drilling fluid, for example, to determine whether the drilling fluid satisfies various drilling requirements. Such properties may include, but are not limited to, density, viscosity, gel strength, and solids content, among others. One property that may be monitored is the average specific gravity of solids in the drilling fluids. The average specific gravity is a property that may be used, for example, to evaluate shale shaker efficiency and to ensure fluid performance. However, ascertaining the average gravity solids typically requires drive measurement by on-site personnel, which can be time consuming and potentially susceptible to human error.

BRIEF DESCRIPTION OF THE DRAWINGS

The features and advantages of certain embodiments will be more readily appreciated when considered in conjunction with the accompanying figures. The figures are not to be construed as limiting any of the preferred embodiments.

FIG. 5A illustrates a plot of an extracted model parameter $p_1$ as a function of time.

DETAILED DESCRIPTION

Figure 1:
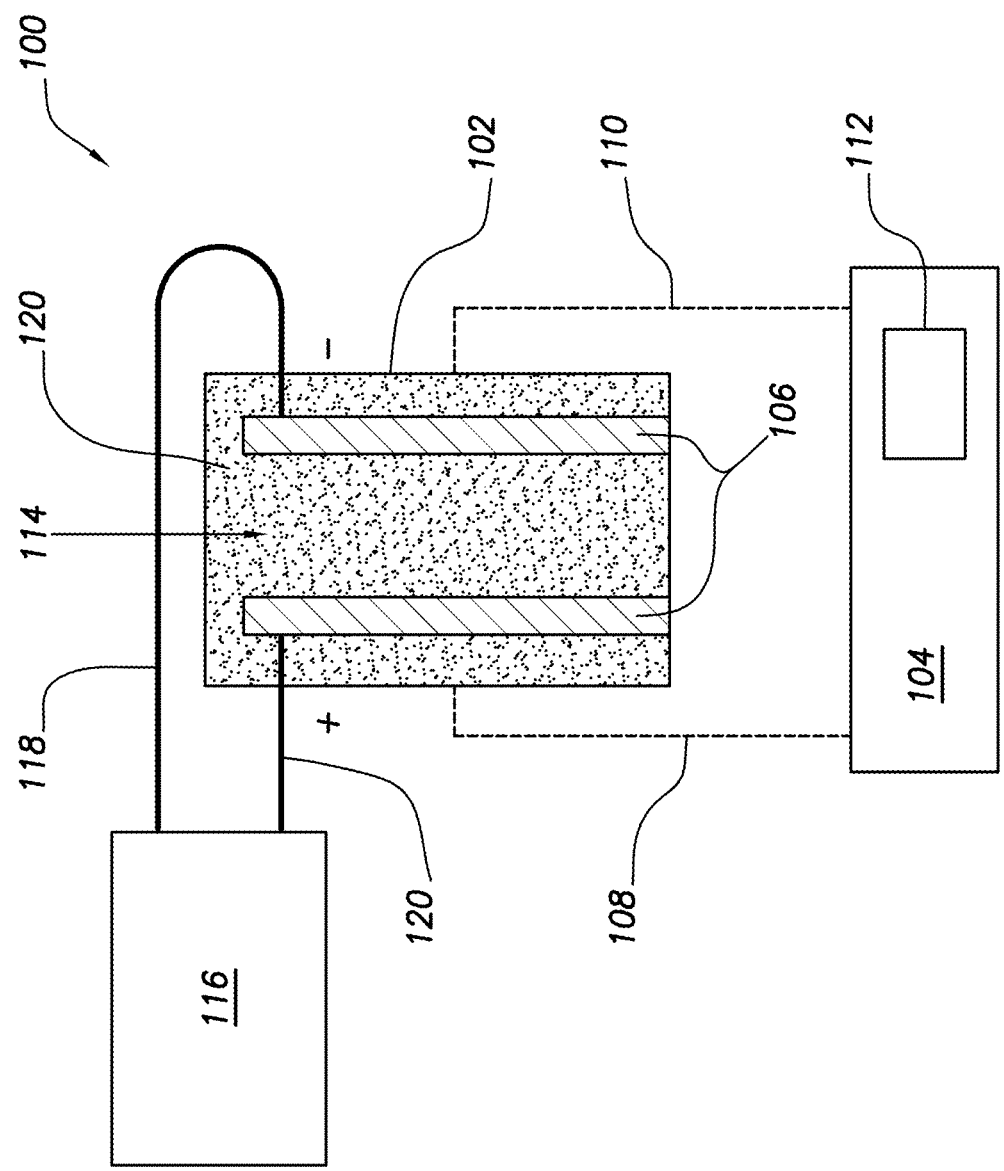
FIG. 1 illustrates an embodiment of an EIS fluid analysis system.

The present disclosure relates to drilling operations and, more particularly, embodiments disclosed herein are directed to systems and methods that use electrochemical impedance spectroscopy (EIS) for average specific gravity (ASG) of solids in drilling fluids. As will be discussed in more detail below, correlations may be developed using EIS that can then be used to characterize the ASG of solids in drilling fluids. For example, the ASG may be characterized by monitoring the change of impedance over time. The EIS analysis may be enhanced by application of a direct current (DC) electric field to the drilling fluid prior to the EIS analysis. The systems and methods may be used to monitor the ASG of solids in a drilling fluid in a mud pit, on a rig, in a mud plant, in a laboratory, or at any other suitable location. EIS is a non-invasive technique for measuring properties of a medium as a function of frequency (also referred to as the excitation frequency). Although the systems and methods described herein with reference to the ASG of solids in drilling fluids, the sag of other fluid types may also be determined using the presently described system and methods.

The drilling fluid may include aqueous-based or hydrocarbon-based drilling fluids. Hydrocarbon-based drilling fluids may include a hydrocarbon liquid as the base fluid, which may be synthetic or oil-based. The hydrocarbon-based drilling fluid may include invert emulsion, which may include an external phase and an internal phase. The external phase may include a hydrocarbon liquid. The external phase may include a hydrocarbon liquid. The external phase can include dissolved materials or undissolved solids. Any suitable hydrocarbon liquid may be used in the external phase, including, but not limited to, a fractional distillate of crude oil; a fatty derivative of an acid, an ester, an ether, an alcohol, an amine, an amide, or an imide; a saturated hydrocarbon; an unsaturated hydrocarbon; a branched hydrocarbon; a cyclic hydrocarbon; and any combination thereof. Crude oil can be separated into fractional distillates based on the boiling point of the fractions in the crude oil. An example of a suitable fractional distillate of crude oil is diesel oil. The saturated hydrocarbon can be an alkane or paraffin. For example, the saturated hydrocarbon may be an isoalkane, a linear alkane, or a cyclic alkane. Examples of suitable saturated hydrocarbons may include a combination of an isoalkane and an n-alkane or a mineral oil blend that includes alkanes and cyclic alkanes. The unsaturated hydrocarbon may include an alkene, alkyne, or aromatic. The alkene may include an isoalkene, linear alkene, or cyclic alkene. The linear alkene may include a linear alpha olefin or an internal olefin. The hydrocarbon liquid may be present in the drilling fluid in an any suitable amount, including an amount ranging from about 1 wt. % to about 90 wt. %, from about 5 wt. % to about 80 wt. %, or from about 20 wt. % to about 70 wt. % based on a total weight of the drilling fluid. For example, the hydrocarbon liquid may be present in the drilling fluid in an amount of about 10 wt. %, about 20 wt. %, about 30 wt. %, about 40 wt. %, about 50 wt. %, about 60 wt. %, about 70 wt. %, about 80 wt. %, or about 90 wt. %, based on a total weight of the drilling fluid. One of ordinary skill in the art with the benefit of this disclosure should recognize the appropriate amount of the aqueous liquid for a chosen application.

The internal phase may include an aqueous liquid. Additional examples of suitable internal phases may include polyols, such as glycerin, or glycols, such as propylene glycol. The aqueous liquid may be from any source provided that it does not contain an excess of compounds that may undesirably affect other components in the drilling fluids. For example, a drilling fluid may include fresh water or salt water. Salt water generally may include one or more dissolved salts therein and may be saturated or unsaturated as desired for a particular application. Seawater or brines may be suitable for use in some examples. The aqueous liquid may be present in the drilling fluid in an any suitable amount, including an amount ranging from about 1 wt. % to about 90 wt. %, from about 5 wt. % to about 80 wt. %, or from about 20 wt. % to about 70 wt. % based on a total weight of the drilling fluid. For example, the aqueous liquid may be present in the drilling fluid in an amount of about 10 wt. %, about 20 wt. %, about 30 wt. %, about 40 wt. %, about 50 wt. %, about 60 wt. %, about 70 wt. %, about 80 wt. %, or about 90 wt. %, based on a total weight of the drilling fluid. One of ordinary skill in the art with the benefit of this disclosure should recognize the appropriate amount of the aqueous liquid for a chosen application.

As previously described, one or more dissolved salts may also be present in the aqueous liquid. Where used, the dissolved salt may be included in the aqueous liquid for any purpose, including, but not limited to, densifying a drilling fluid including water to a chosen density. A mixture of one or more dissolved salts and water may be used in some instances. The amount of salt that should be added may be the amount needed to provide a desired density. One or more salts may be added to the water to provide a brine that includes the dissolved salt and the water. Suitable dissolved salts may include monovalent (group I) and divalent salts (group II). Mixtures of monovalent, divalent, and trivalent salts may also be used. Suitable salts may include, but are not limited to, calcium chloride, sodium chloride, sodium bromide, potassium bromide, potassium chloride, potassium formate, cesium formate, lithium chloride, lithium bromide sodium formate, lithium formate, ammonium chloride, organic cation salts such as tetramethyl ammonium chloride, choline chloride, and mixtures thereof among others. The salt may be provided in any amount or concentration such as unsaturated, saturated, supersaturated, and saturated with additional solids. For example, the salt may be provided in an amount ranging from about 1 wt. % to about 40 wt. %, 2 wt. % to about 30 wt. %, or about 5 wt. % to about 25 wt. % based on a total weight of the aqueous liquid. Alternatively, the salt may be present in the drilling fluid in an amount of about 1 wt. %, about 10 wt. %, about 20 wt. %, about 30 wt. %, or about 40 wt. % based on a total weight of the drilling fluid. One of ordinary skill in the art with the benefit of this disclosure should recognize the appropriate amount of the salt for a chosen application.

The drilling fluids may include an emulsifying surfactant. Emulsifying surfactants may include, without limitation, fatty amines, ethoxylated nonylphenols, fatty acids, fatty acid esters, and combinations thereof. In general, suitable emulsifying surfactants may have a Griffin's HLB (hydrophilic-lipophilic balance) of about 9 or greater may be suitable used. Fatty acids and fatty acid esters may be of particular interest as they are generally non-hazardous to the working environment and may pose little environmental risk. The Griffin's HLB values may be calculated by the following formula:

$$HLB = 20 * \frac{M_h}{M}$$

where $M_h$ is the molecular mass of the hydrophilic portion of the molecule and M is the molecular mass of the whole molecule. One of ordinary skill in the art with the benefit of this disclosure should be able to determine if a particular emulsifying surfactant includes a Griffin's HLB value of greater than about 9.

One of ordinary skill will appreciate that the emulsifying surfactants may be present in any amount suitable for a particular application. In some examples, without limitation, the emulsifying surfactant may be present in the drilling fluid in an amount ranging from about 0.5 wt. % to about 10 wt. %, about 1 wt. % to about 5 wt. %, or about 1 wt. % to about 3 wt. % based on a total weight of the drilling fluid. Specific amounts of the emulsifying surfactant may include, but are not limited to about 0.5 wt. %, about 1 wt. %, about 2 wt. %, about 3 wt. %, about 4 wt. %, about 5 wt. %, about 6 wt. %, about 7 wt. %, about 8 wt. %, about 9 wt. %, or about 10 wt. % based on a total weight of the drilling fluid. One of ordinary skill in the art with the benefit of this disclosure should recognize the appropriate amount of the emulsifying surfactant for a chosen application.

In addition, a weight agent may be included in the drilling fluid. Weighting agents are typically particulate materials with a high-specific gravity. As used herein, the term "high-specific gravity" refers to a material having a specific gravity greater than 2.6. Examples of suitable weighting agents may include, but are not limited to, barite, hematite, ilmentite, manganese tetraoxide, galena, calcium carbonate, and combinations thereof. The weight agent may be present in the drilling fluid in an amount sufficient for a particular application. For example, the weighting agent may be included in the drilling fluid to provide a particular density. Suitable amounts of the weighting agent may include, but are not limited to, the weighting agent present in the drilling fluid in an amount about to about 50% by volume of the drilling fluid (vol %) (e.g., about 5 vol %, about 15 vol %, about 20 vol %, about 25 vol %, about 30 vol %, about 35 vol %, about 40 vol %, about 45 vol %, etc.). For example, the weighting agent may be present in the drilling fluid in an amount ranging from of about 10 vol % to about 40 vol %. One of ordinary skill in the art with the benefit of this disclosure should recognize the appropriate type and amount of the weighting agent for a chosen application.

A wide variety of additional additives may be included in the drilling fluids as desired for a particular application. Suitable additives may include, but are not limited to, clays, viscosifiers, shale stabilizers, lost circulation materials, and wetting agents, among others. Suitable viscosifiers may include, but are not limited to, water soluble starches and modified versions thereof, water-soluble polysaccharides and modified versions thereof, water soluble celluloses and modified versions thereof, water soluble polyacrylamides and copolymers thereof, biopolymers, and combinations thereof. One of ordinary skill, with the benefit of this disclosure, should be able to select additional drilling fluid additives for a particular application.

Those of ordinary skill in the art will appreciate that the drilling fluid generally should have a density suitable for a particular application. By way of example, the drilling fluid may have a density in the range of from about 7 pounds per gallon ("lb/gal") (838.8 kg/m$^3$) to about 20 lb/gal (2397 kg/m$^3$). In certain embodiments, the drilling fluid may have a density ranging from about 8 lb/gal (958.6 kg/m$^3$) to about 12 lb/gal (1438 kg/m$^3$), from about 12 lb/gal (1438 kg/m$^3$) to about 16 lb/gal (1917 kg/m$^3$), or from about 16 lb/gal (1917 kg/m$^3$) to about 20 lb/gal (2397 kg/m$^3$). Those of ordinary skill in the art, with the benefit of this disclosure, should recognize the appropriate density for a particular application.

When drilling a wellbore, the drilling fluid may be continuously circulated from the well surface down to the bottom of the wellbore being drilled and back to the well surface again. As previously described, it may be desired to monitor properties of the drilling fluid, such as the ASG of the solids in the drilling fluid. Solids in the drilling fluids may include, but are not limited to weight agents, lost circulation materials and, drill solids (e.g., formation clays, shales, salts, sand, carbonates, mica, feldspars etc.), among others.

The methods and systems disclosed may use EIS to monitor the ASG of solids in drilling fluids. The systems and methods may be used to monitor the ASG of solids in the drilling fluid in a mud pit, on a rig, in a mud plant, in a laboratory, or at any other suitable location. Prior to using EIS to analyze the ASG of solids in a drilling fluid, tests may be performed to measure impedance of a drilling fluid as a function of frequency. The EIS analysis may be enhanced by application of a DC electric field to the drilling fluid. The DC electric field may be turned off during the EIS measurement and then turned back off after the EIS measurement. An equivalent circuit model may then be used to fit the measured impedance data from which model parameters may be extracted. The model parameters may be correlated to drilling fluid properties to ASG of solids in the drilling fluid.

FIG. 1 illustrates an EIS fluid analysis system 100 that may be used to measure impedance for a drilling fluid. As illustrated, the EIS fluid analysis system 100 may include a container 102 and an EIS analyzer 104. Container 102 may be any suitable container for holding a sample fluid 114. A pair of electrodes, in the form of plates 106, may be disposed in container 102. Plates 106 may have any suitable configuration. As illustrated, plates 106 may be generally parallel to one another. Plates 106 are considered generally parallel where they converge or diverge by no more than 5°. In addition, plates 106 are shown disposed in container 102 in a vertical configuration. While plates 106 are shown in the vertical configuration, it should be understood that plates 106 may be disposed in container 102 in other configurations, including, but not limited to, horizontal and angled configurations. It should understood that the plates 106 should be considered in a vertical configuration where the longitudinal axis of the plates 106 extend at angle of from 85° to 95° with respect to the horizontal plane. While FIG. 1 illustrates, the use of plates 106, it is not necessary for EIS fluid analysis system 100 to include plates 106, but any of variety of different of electrodes may be used in the analysis, including but not limited to, concentric cylinders and bars. In general, any suitable configuration may be used that permits a current to pass through a fluid. For example, other types of capacitor-based sensors could be used, including, but not limited to, open-ended co-axial probes, spiral capacitors, or planar interdigital capacitors.

EIS analyzer 104 may be in signal communication with plates 106. As illustrated, lines 108, 110 may couple plates 106 to EIS analyzer 104. EIS analyzer 104 may measure impedances of sample fluid 114 in container 102. The EIS analyzer 104 may include signal generator 112. As illustrated, AC signal generator 112 is shown as a component of EIS analyzer 104, but AC signal generator 112 may also be separate from EIS analyzer 104. AC signal generator 112 by way of EIS analyzer 104, for example, may apply an alternating current (AC) electric signal to plates 106 so that an AC electric signal passes through sample fluid 114 in container 102. The AC current electric signal may include a frequency sweep from about 10 Hertz (Hz) to about 500 KiloHertz (KHz), from about 20 Hz to about 200 KHz, or from about 20 Hz to about 100 KHz. Lines 108, 110 may allow EIS analyzer 104 to capture measurements of sample fluid 114 during application of the electrical signal. By way of example, the EIS analyzer 104 may determine current through sample fluid 114 in container 102, the potential difference across the sample fluid 114 in container 102, and/or the phase angle θ. From these measurements, the real and imaginary parts of the impedance may be determined.

EIS fluid analysis system 100 may further include a DC power supply 116. As illustrated, the DC power supply 116 may be in signal communication with the electrodes, shown as plates 106. As illustrated, lines 108, 110 may couple plates 106 to DC power supply 116. DC power supply 116 may apply a DC electric field to the plates. The DC electric field may include, for example, a constant DC voltage to provide an electric field strength at a point ranging from about 100 Volts per millimeter ("V/mm") to about 10,000 V/mm, from about 100 V/mm to about 1000 V/mm, or from about 150 V/mm to about 250 V/mm.

In operation, the EIS fluid analysis system 100 may be used to measure the impedance of sample fluid 114 over time. As shown in FIG. 1, sample fluid 114, which may be a drilling fluid, may be placed in container 102. Solids 120, such as weighting agents, drill solids, and lost circulation materials, among others, may be included in sample fluid 114. DC power supply 116 may be used to apply the DC electric field to the sample fluid 114. The DC electric field may be applied over a period of time. The period of time for application of the DC electric field may range, for example, from about 10 seconds to about 8 hours, from about 1 minute to about 5 hours, of from about 30 minutes to about 2 hours. The DC electric field may be turned off and the EIS analyzer 104 may be used to collect measurements. Signal generator 112 by way of EIS analyzer, for example, may apply an AC electric signal to the plates 106 so that the AC electric signal pass through sample fluid 114 in outer cylindrical container 102. Lines 108, 110 may allow EIS analyzer 104 to capture measurements of sample fluid 114 during application of the AC electric signal.

EIS measurements of sample fluid 114 may be taken over time. Typically, impedance Z(ω) of a fluid at an angular frequency ω=2πf is given by $Z(\omega)=Z'(\omega)+iZ''(\omega)$, where $Z'(\omega)$ is the real part (i.e., resistance) of the impedance and $Z''(\omega)$ is the imaginary part (i.e., reactance) of the impedance. The variation in the impedance in the angular frequency can be represented using a Nyquist plot.

Figure 2:
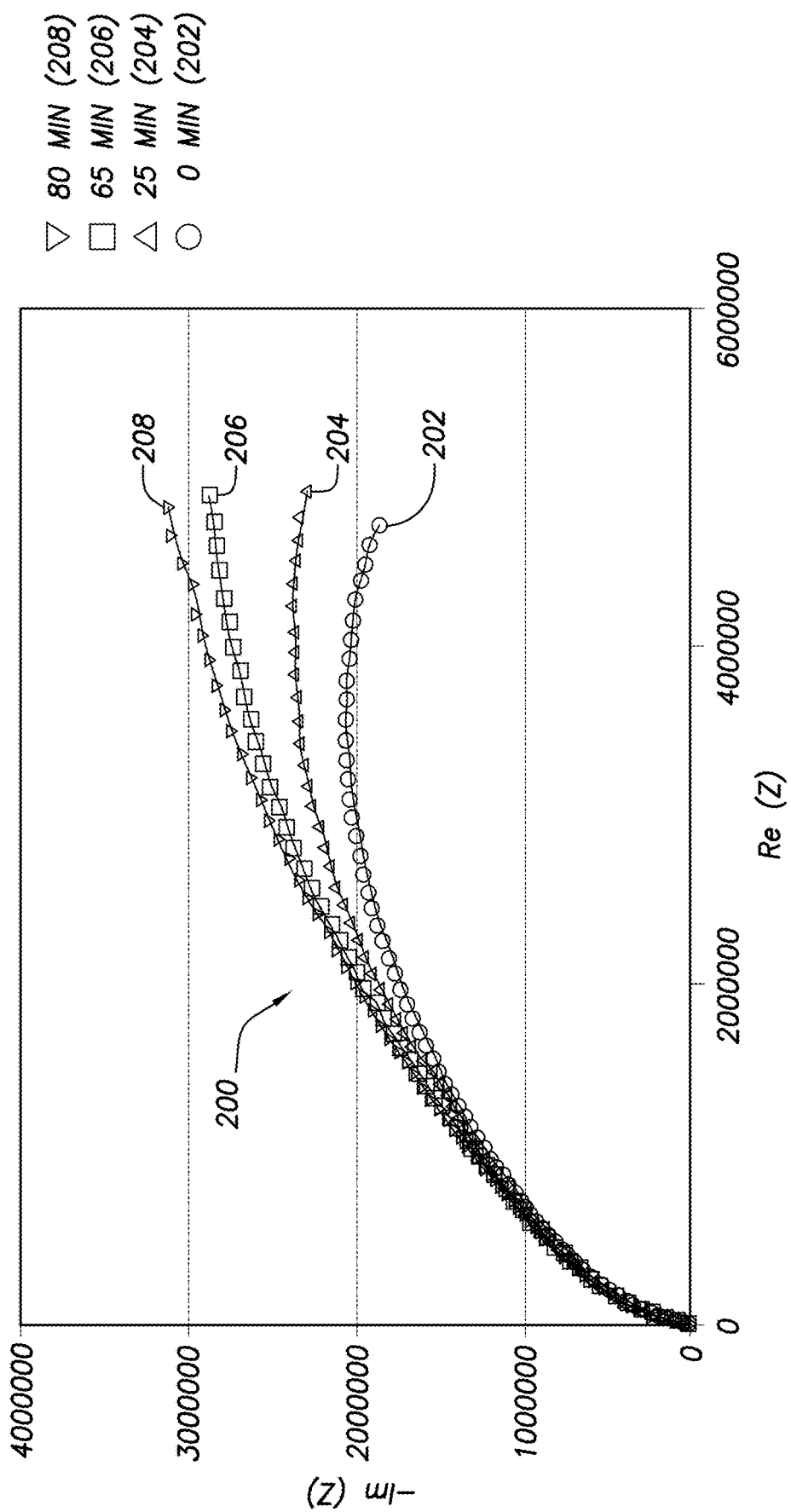
FIG. 2 illustrates Nyquist plots of a drilling fluid using an EIS fluid analysis system over different periods of time for application of a direct current electric field.

FIG. 2 is a Nyquist plot 200 illustrating the frequency response for a sample fluid 114 (e.g., a drilling fluid) with different periods of time for application of the DC electric field. Nyquist plot 200 depicts a curve 202, curve 204, curve 206, and curve 208 for DC electric field application of 0 minutes, 25 minutes, 65 minutes, and 80 minutes, respectively. The open circles represent experimental data while the lines are model fitting. Specifically, FIG. 2 depicts the variation in the impedance of sample fluid 114 due to variation in angular frequency. In FIG. 2, the resistance (or real part of the impedance) is represented on x-axis while the reactance (or imaginary part of the impedance) is represented on the y-axis. For the measurements shown on FIG. 2, the AC signal frequency was varied from 20 Hz to 100 kHz and the DC electric field was a constant 100 volts. The gap between plates 106 (e.g., shown on FIG. 1) was 0.19 inches, corresponding to an electric field strength of 20,721 V/m. The measurements were taken at room temperature. The sample fluid 114 had a density of 12 pounds per gallon (1198 kg per m$^3$) and an oil-to-water weight ratio of 80/20. The solids included in the sample fluid 114 were 30 pounds per barrel (86 kg/m$^3$) of finely ground clay to simulate drill solids.

Figure 3:
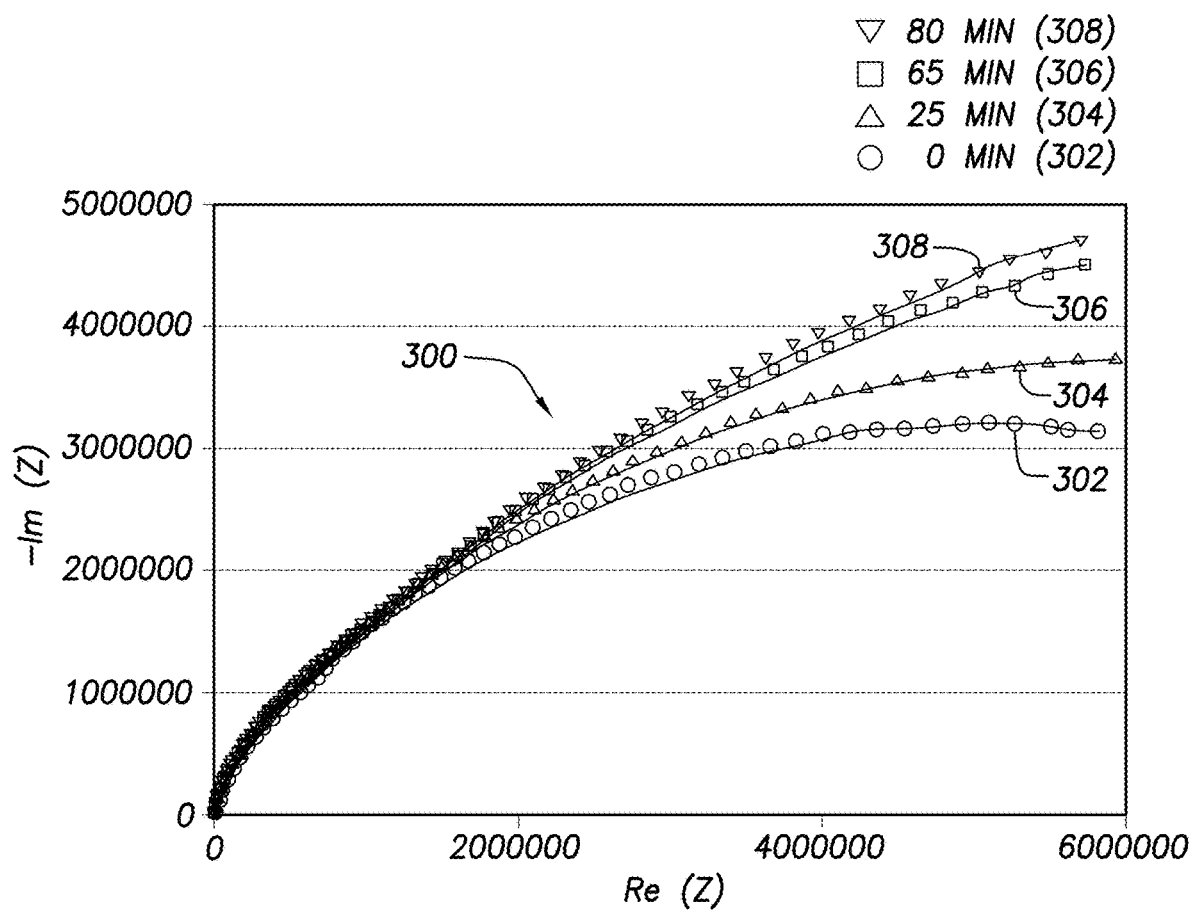
FIG. 3 illustrates Nyquist plots of another drilling fluid using an EIS fluid analysis system over different periods of time for application of a direct current electric field.

FIG. 3 is a Nyquist plot 300 illustrating the same measurement results of FIG. 2 for the same sample fluid 114, but with a different concentration of the finely ground clay. In particle, the measurements for FIG. 3 included 60 pounds per barrel (172 kg/m$^3$) of finely ground clay to simulate drill solids. In FIG. 3, Nyquist plot 300 depicts a curve 302, curve 304, curve 306, and curve 308 for DC electric field application of 0 minutes, 25 minutes, 65 minutes, and 80 minutes, respectively. The open circles represent experimental data while the lines are model fitting.

Figure 4:
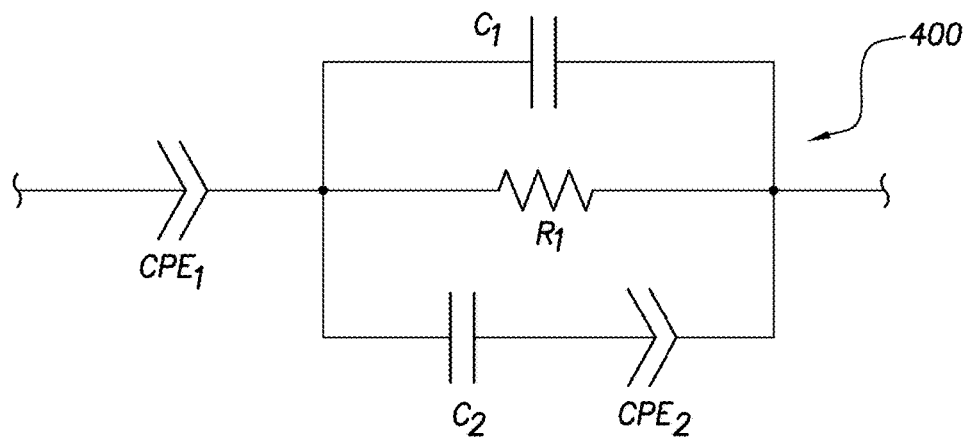
FIG. 4 illustrates an equivalent circuit model for simulating data from an EIS fluid analysis system.

The impedance of the sample fluid 114 (e.g. a drilling fluid) depicted in FIGS. 2 and 3 may be simulated using an equivalent circuit model. FIG. 4 illustrates an equivalent circuit model 400 for simulating the frequency responses of the sample fluid 114 depicted in Nyquist plots 200 and 300 of FIGS. 2 and 3, respectively, for different times. Any suitable equivalent circuit model that can singularly simulate (model) the frequency responses for sample fluid 114 may be used.

As illustrated, the equivalent circuit model 400 may include various model elements, including a first capacitor C1, a second capacitor C2, a resistor R1, and first and second constant phase elements CPE1 and CPE2, respectively. The equivalent circuit impedance ($Z_{eq}$) may be given by:

$$Z_{eq}(\omega) = Z_{CPE1}(\omega) + \frac{Z_{R1}Z_{C1}(\omega)(Z_{C2}(\omega) + Z_{CPE2}(\omega))}{Z_{C1}(\omega)(Z_{C2}(\omega) + Z_{CPE2}(\omega)) + Z_{R1}(Z_{C1}(\omega) + Z_{C2}(\omega) + Z_{CPE2}(\omega))}$$

Where $Z_{C1}$, $Z_{C2}$, $Z_{R1}$, $Z_{CPE1}$, $Z_{CPE2}$ represent the impedances of the capacitors C1 and C2, resistor R1, and constant phase elements CPE1 and CPE2, respectively. The complex impedances for each model element may be given by:

$$Z_{R1}(\omega) = R_1$$
$$Z_{C1}(\omega) = \frac{1}{i\omega C1}$$
$$Z_{C2}(\omega) = \frac{1}{i\omega C2}$$
$$Z_{CPE1}(\omega) = \frac{1}{p_1(i\omega)^{n_1}}$$
$$Z_{CPE2}(\omega) = \frac{1}{p_2(i\omega)^{n_2}}$$

The capacitive or resistive nature of the constant phase elements CPE1 and CPE2 may be determined based on the values of $n_1$ and $n_2$. When $n_1$=1, CPE1 represents an ideal capacitor and $p_1$ represents the value of the capacitance of the capacitor CPE1. When $n_1$=0, CPE1 represents an ideal resistor and $p_1$ represents the value of the resistance of the resistor CPE1. For a value of $n_1$ between 0 and 1 (0<n1, 1), CPE1 represents a non-ideal capacitor. Similarly, when $n_2$=1, CPE2 represents an ideal capacitor and $p_2$ represents the value of the capacitance of the capacitor CPE2 and when $n_2$=0, CPE2 represents an ideal resistor and $p_2$ represents the value of the resistance of the resistor CPE2. For a value of $n_2$ between 0 and 1 (0<$n_2$<1), CPE2 represents a non-ideal capacitor.

Figure 9:
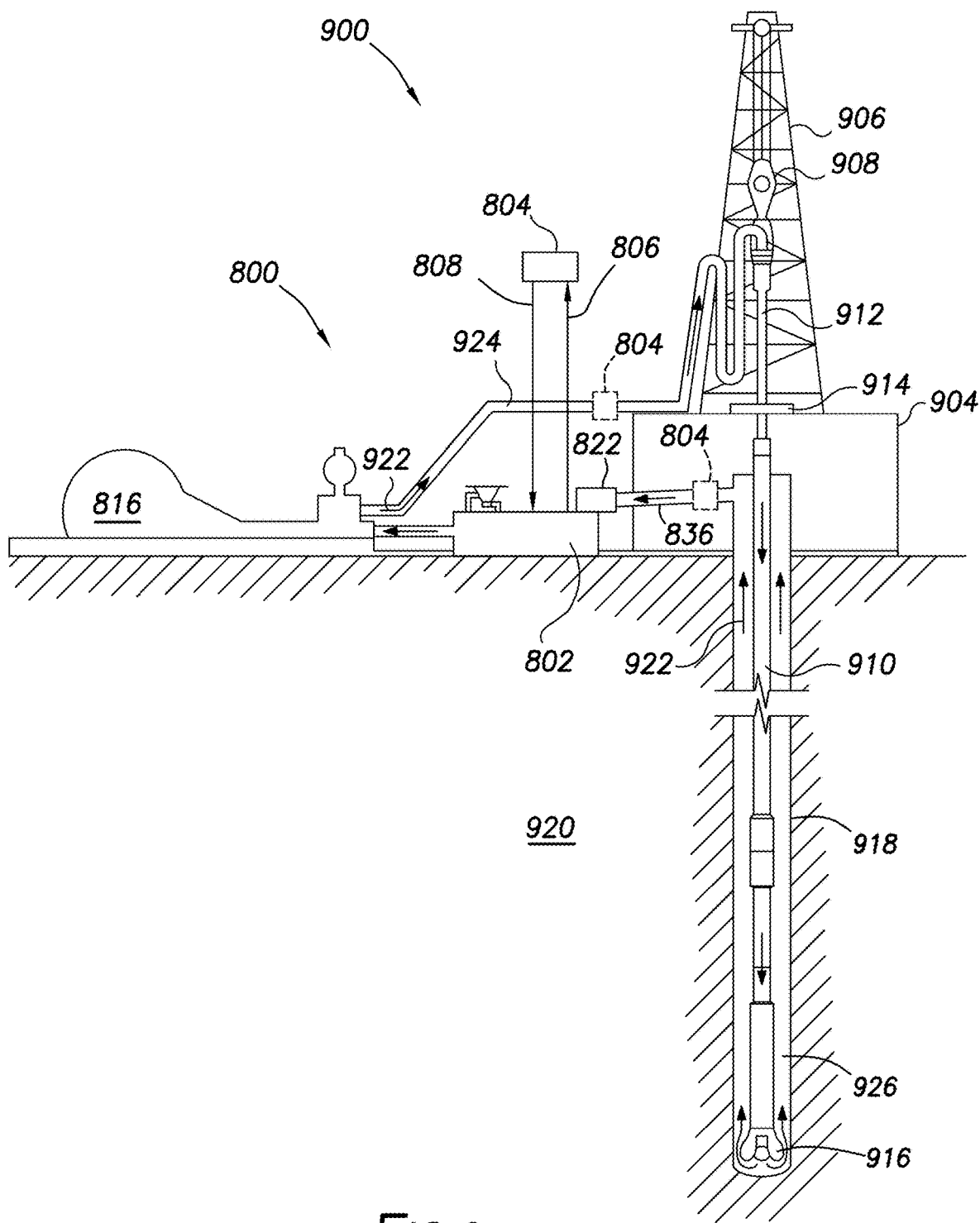
FIG. 9 illustrates an example drilling assembly that incorporates the drilling fluid monitoring and handling system of FIG. 8.

In an example, the model parameters $R_1$, $C_1$, $C_2$ $p_1$, $n_1$, $p_2$, and $n_2$ of the equivalent circuit model 400 may be extracted using a complex least-square fitting procedure that minimizes a desired objective function. The desired objective function may be given by:

$$minSum = \sum_{k1}^{N} w_k \cdot \{[Z'(\omega_k) - Z'_{eq}(\omega_k)]^2 + [Z''(\omega_k) - Z''_{eq}(\omega_k)]^2\}$$

Where k represents the k$^{th}$ measured data point at angular frequency $\omega_k$, Z' is the real part of the measured impedance, Z" is the imaginary part of the measured impedance, and $w_k$ is the optional weight used at each data point. FIG. 9 shows an example of the fitted model prediction to the experimental data shown in FIG. 7. The change if impedance at the frequency may be correlated with sag. The frequency may be fixed at any suitable amount, including 5000 Hz or less.

Figure 5B:
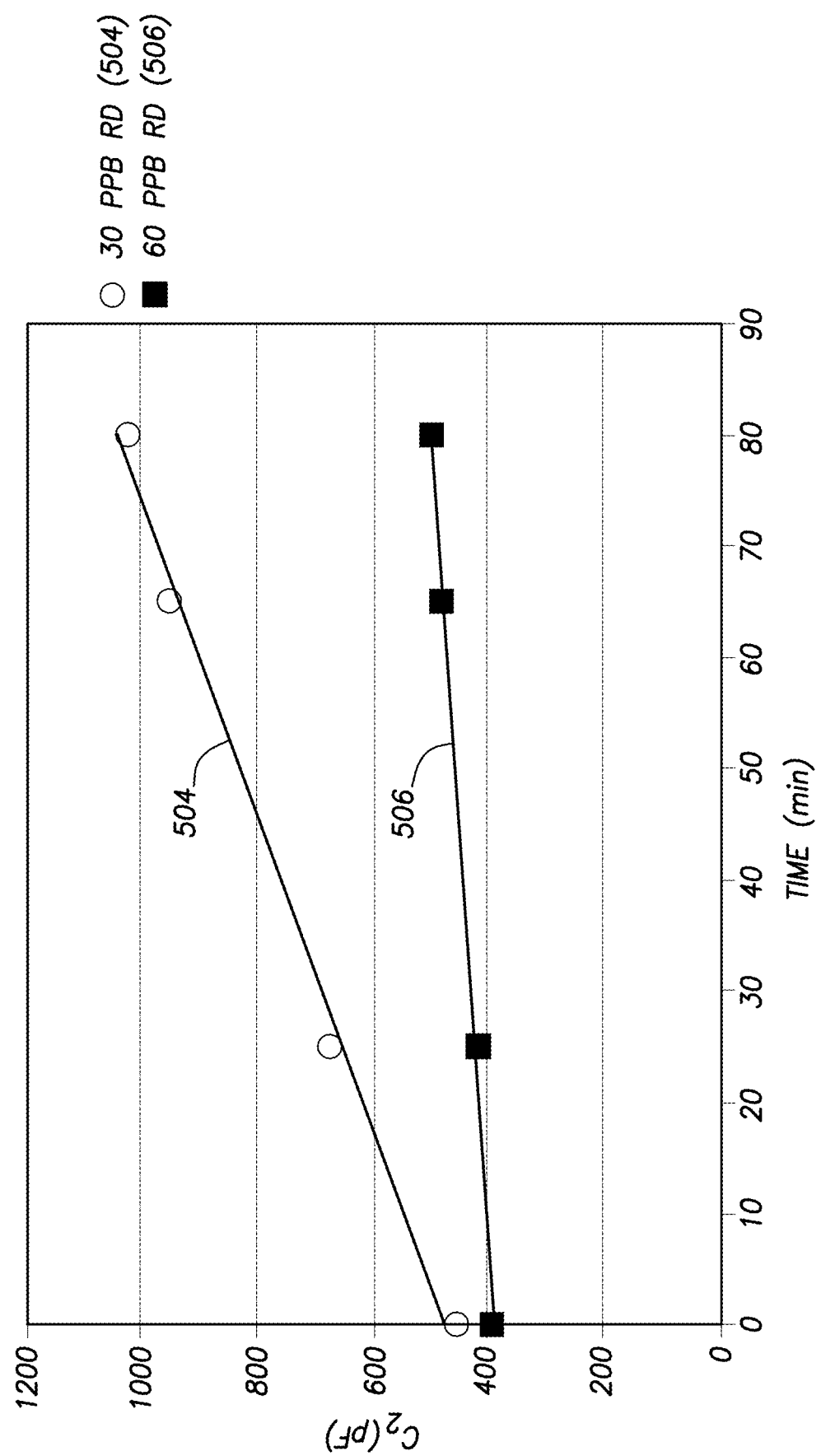
FIG. 5B illustrates a plot of an extracted model parameter $C_2$ as a function of time.

After the parameters may be extracted from the measured data, correlations between the model parameters and the ASG of solids in the drilling fluid may be established. These parameters may be used to characterize the ASG solids in a drilling fluid. For example, parameter $p_1$ was found to decrease linearly over the duration of time when the DC electric field is applied to the drilling fluid. The slope of this linear correlation depends on the low gravity solids in the drilling fluid, which can be used to calculate ASG Low gravity solids refers to solids with a specific gravity of 2.6 or lower. FIG. 5A illustrates model parameter $p_1$ that was extracted as a function of time. FIG. 5A includes curve 500 for the measurements from FIG. 2 with 30 pounds per barrel (86 kg/m$^3$) of finely ground clay and curve 502 for the measurements from FIG. 3 with 60 pounds per barrel (172 kg/m$^3$) of finely ground clay. As illustrated, the model parameter $p_1$ decrease linearly over the duration of time when the DC electric field is applied to the drilling fluid and the slope depends on the concentration of the low gravity solids (e.g., the finely ground clay). Other models parameters could also be extracted. For example, FIG. 5B illustrates model parameter $C_1$ that was extracted as a function of time. FIG. 5B includes curve 504 for the measurements from FIG. 2 with 30 pounds per barrel (86 kg/m$^3$) of finely ground clay and curve 506 for the measurements from FIG. 3 with 60 pounds per barrel (172 kg/m$^3$) of finely ground clay. By developing correlations for more than one parameter the robustness of this inversion process may be enhanced.

Figure 6:
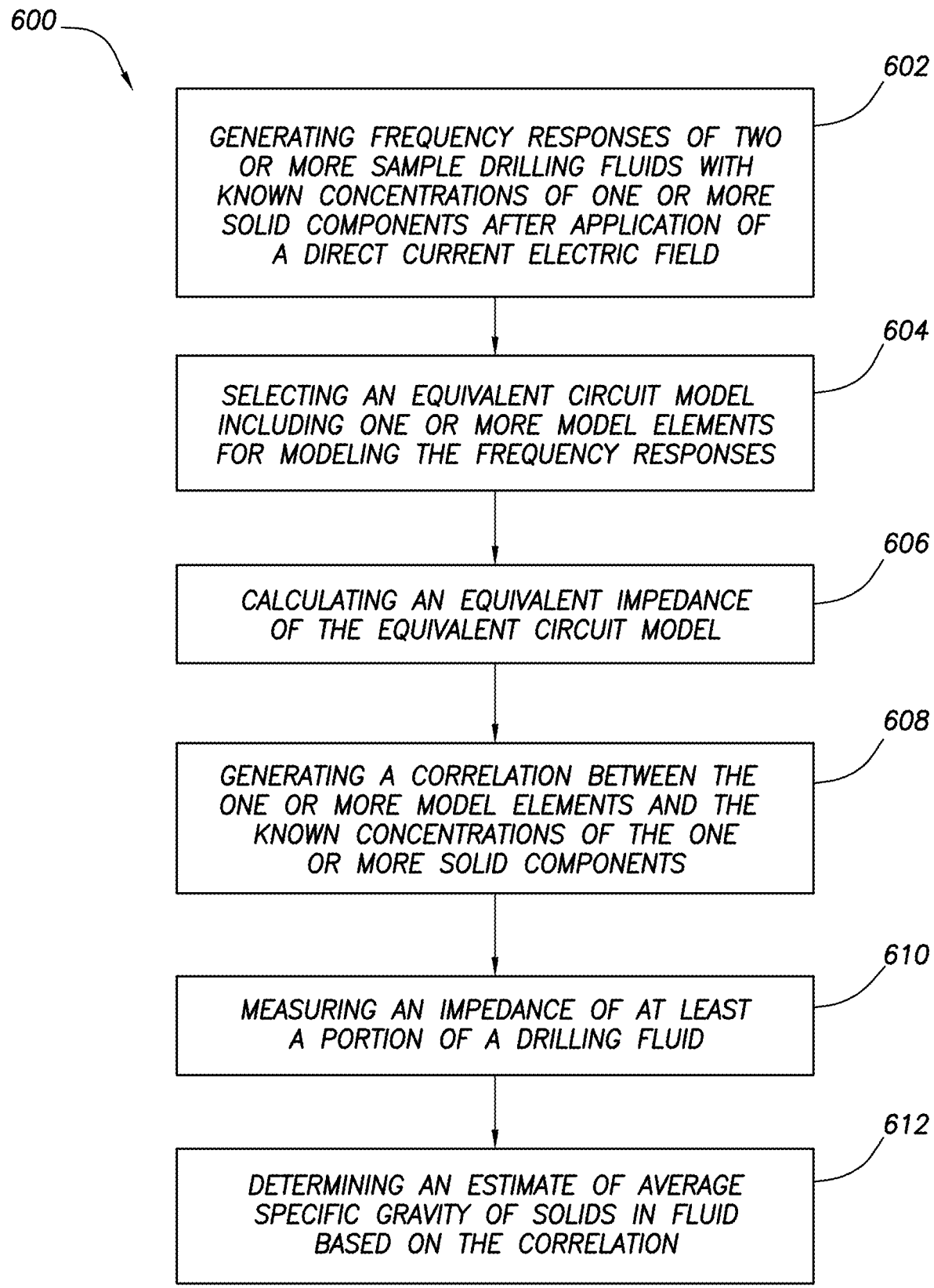
FIG. 6 illustrates a flow chart of an example method for using electro-rheology in determining average specific gravity of solids in a drilling fluid.

FIG. 6 a flow chart of a method 600 for using electrorheology in determining ASG of solids in a drilling fluid. In particular, the method 600 may be used to determine an estimate of ASG of solids in a drilling fluid. The method 600 may include generating frequency responses of two or more sample drilling fluids, as shown at block 602. The two or more sample drilling fluids may have known concentrations of one or more solid components. The frequency responses may be generated by EIS analysis after application of a DC electric field. As described previously, the sample drilling fluids may have any suitable composition. For example, the sample drilling fluids may include an invert emulsion, wherein an external phase of invert emulsion including the hydrocarbon liquid and the internal phase of the invert emulsion includes the aqueous liquid. The concentration of the solid component in each of the sample drilling fluids may be different. The sample drilling fluids may include two, three, four, five, or more sample drilling fluids.

At block 604, the method 600 may further include selecting an equivalent circuit model (e.g., equivalent circuit model 400 shown on FIG. 4) including one or model elements for modeling the frequency responses. Parameters that may be extracted may depend on the particle equivalent circuit model but may include, but are not limited to, $R_1$, $C_1$, $C_2$, $p_1$, $n_1$, $p_2$, and $n_2$, for example, of equivalent circuit model 400 on FIG. 4.

At block 606, the method 600 may further include calculating an equivalent impedance of the equivalent circuit model. At block 608, the method 600 may further include generating a correlation between the one or more model elements and the known concentrations of the one or more solid components. At block 610, the method 600 may further include measuring an impedance of at least a portion of a drilling fluid. The impedance may be measured in a mud pit, on a rig, in a mud plant, in a laboratory, or at any other suitable location. By way of example, the impedance may be measured downhole or continuously in a flow line using a suitable EIS probe. At block 612, the method 600 may further include determining at least one property of the drilling fluid based on the correlation. If the impedance is measured at two or more locations, for example, prior to pumping the drilling fluid downhole and on the returned drilling fluid, a fluid loss profile may be developed from the impedance measurements.

Figure 7:
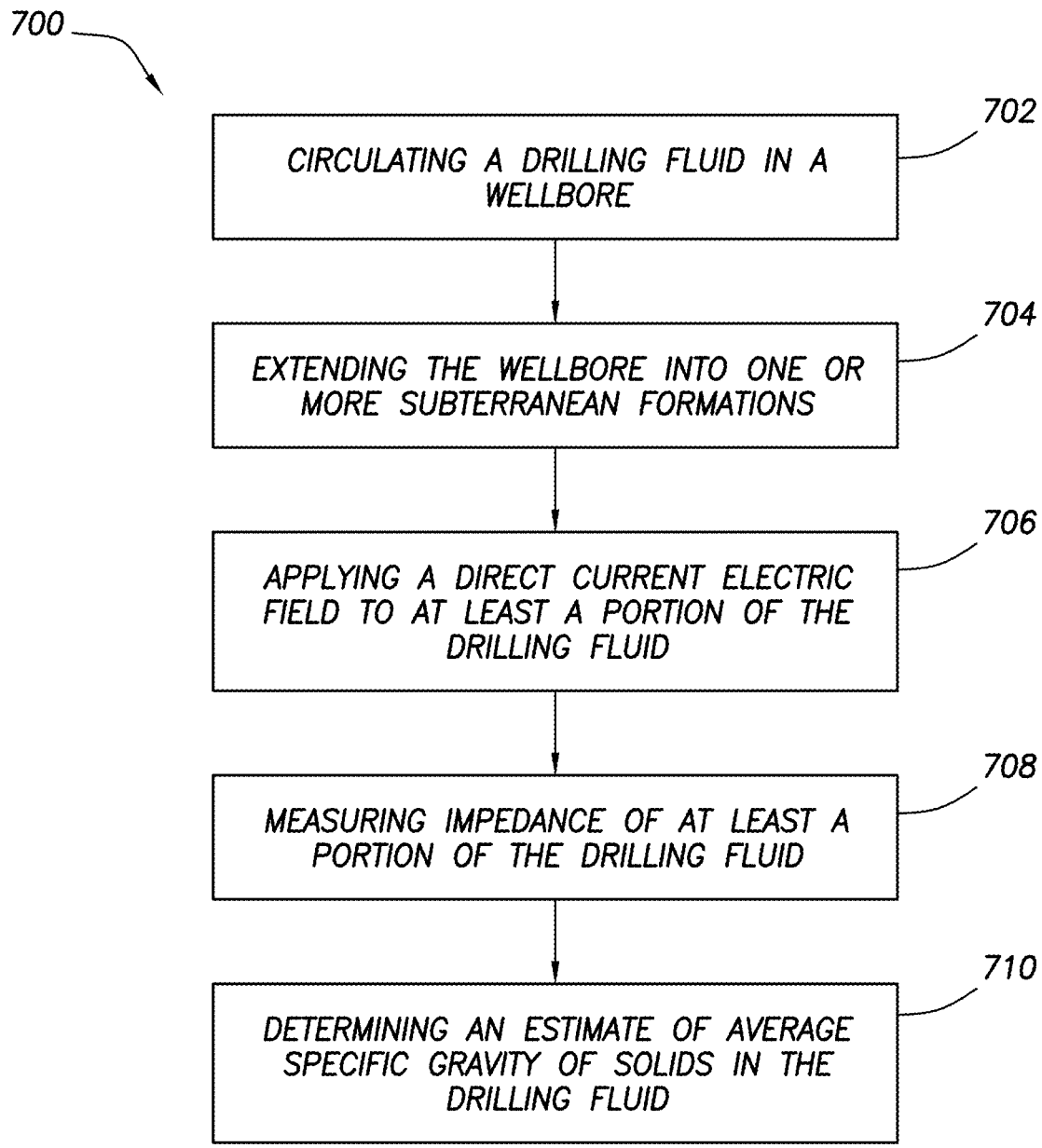
FIG. 7 illustrates a flow chart of an example method for estimating average specific gravity of solids in a drilling fluid.

FIG. 7 illustrates a flow chart of a method 700 for estimating ASG of solids in a drilling fluid. At block 702, the method 700 may include circulating a drilling fluid in a wellbore. At block 704, the method 700 may include extending the wellbore into one or more subterranean formations. At block 706, the method 700 may include applying a direct current electric field to at least a portion of the drilling fluid. At block 708, the method 700 may include measuring impedance of the drilling fluid over time. However, in some instances, this impedance measurement may be made without the applied direct current electric field, for example, if it is assumed the general slope has not changed much. At block 710, the method 700 may include determining an estimate of ASG of solids in the drilling fluid. The determining may use a correlation between a model parameter and ASG.

Figure 8:
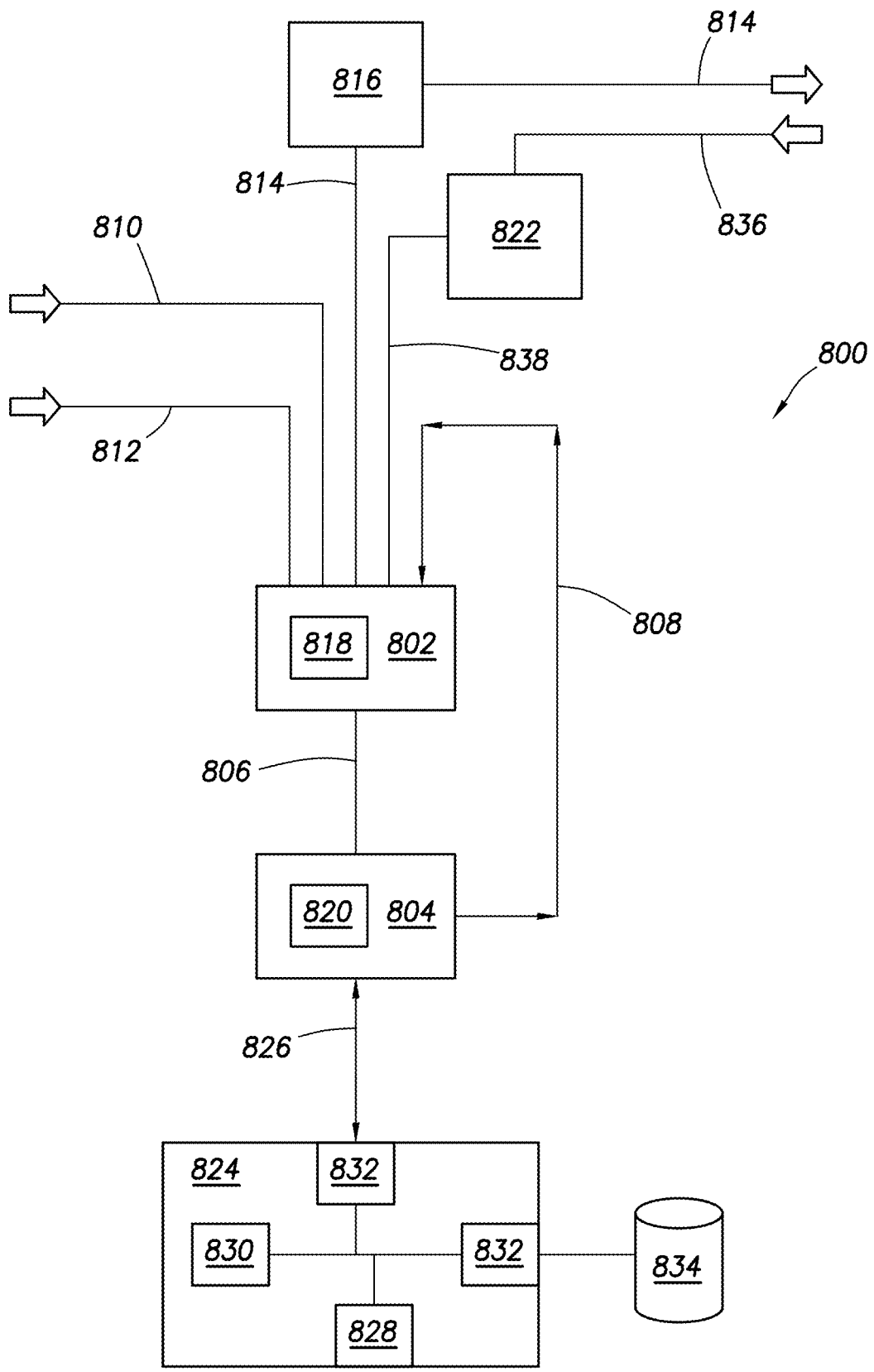
FIG. 8 illustrates a block diagram of a drilling fluid monitoring and handling system.

FIG. 8 illustrates a block diagram of a drilling fluid monitoring and handling system 800 for determining ASG of solids in a drilling fluid. As illustrated, the fluid monitoring and handling system 800 may generally include a mud pit 802 and a fluid analysis system 804. A portion of the drilling fluid from the mud pit 802 may be fed via a mud pit line 806 to the fluid analysis system 804, which may be configured to perform electro-rheology measurements on the portion of the drilling fluid supplied thereto. The fluid analysis system 804 may analyze the drilling fluid using the example method disclosed above with respect to FIGS. 1-7. After fluid analysis, the portion of the drilling fluid may be returned to mud pit 802 via a return line 808.

The mud pit 802 may be any vessel suitable for holding a drilling fluid. For example, the mud pit 802 may include a container such as a drum or tank, or a series of containers that may or may not be connected. The mud pit 802 may be supplied with the drilling fluid from an initial drilling fluid supply line 810 that provides an initial supply of drilling fluid to the mud pit 802. However, the initial supply of drilling fluid does not imply that the drilling fluid has not been recycled or circulated in a wellbore, but simply indicates that this supply is not presently being circulated or otherwise used in the wellbore.

Drilling fluid additives (e.g., emulsifying agents, clay, viscosifiers, weighting agents, lost circulation materials, etc.) may be added via a drilling fluid additive supply line 812 to the mud pit 802, if desired, and based on the analysis provided by the fluid analysis system 804. Alternatively or additionally, in an example, the results of the analysis may be used to modify the manufacturing process of the drilling fluid. After the drilling fluid additives have been added to the drilling fluid, the drilling fluid may be retested using the fluid analysis system 804 to verify the drilling fluid was correctly formulated or the drilling fluid may be sent to the wellbore for use in drilling operations via a wellbore line 814 by way of mud pump 816.

The mud pit 802 may include a mixing system 818 to mix the contents of the mud pit 802 as well as any drilling fluid additives. For instance, the mixing system 818 may mix the drilling fluid in the mud pit 802 with drilling fluid from the initial drilling fluid supply line 810, drilling fluid from the return line 808, drilling fluid additives, additional non-aqueous fluids, aqueous fluids or combinations thereof. In general, the mixing system 818 may be configured to prevent solids within the drilling fluid from settling. The mixing system 818 may use any suitable mixing technique for mixing of the drilling fluid. For instance, the mixing system 818 may include a static mixer, dynamic mixer, or other suitable mixer. The mud pit 802 may further include suitable pumping equipment (not shown) t to pump the drilling fluid in the mud pit 802 to the fluid analysis system 804 via mud pit line 806.

The fluid analysis system 804 may analyze the portion of the drilling fluid in a continuous or non-continuous manner, as desired, and based on whether flow through fluid analysis system 804 is continuous or non-continuous. The fluid analysis system 804 may include one or more instruments 820, such as an EIS probe, for measuring rheology of the drilling fluid while applying an electric field to the drilling fluid.

Although the fluid analysis system 804 is shown at the mud pit 802, examples disclosed herein contemplate the placement of fluid analysis system 804 or at least a portion thereof, such as one or more instruments 820 (e.g., EIS probes), at any point in the fluid monitoring and handling system 800. For example, one or more instruments 820 of the fluid analysis system 804 may alternatively be placed in a fluid reconditioning system 822 (discussed below), the mud pit 802, wellbore line 814, or in an exit conduit (e.g., drilling fluid return line 836). As such, examples disclosed herein contemplate measuring the impedance at any point in the drilling fluid handling process, so that the drilling fluid may be monitored and/or subsequently adjusted as desired.

The analysis performed by fluid analysis system 804 may be performed in collaboration with a computer system 824 communicably coupled thereto. As illustrated, the computer system 824 may be an external component of the fluid analysis system 804; however, the computer system 824 may alternatively include an internal component of the fluid analysis system 804, without departing from the scope of the disclosure. The computer system 824 may be connected to the fluid analysis system 804 via a communication link 826. The communication link 826 may include a direct (wired) connection, a private network, a virtual private network, a local area network, a WAN (e.g., an Internet-based communication system), a wireless communication system (e.g., a satellite communication system, telephones), any combination thereof, or any other suitable communication link.

The computer system 824 may be any suitable data processing system including, but not limited to, a computer, a handheld device, or any other suitable device. The computer system 824 may include a processor 828 and a non-transitory computer readable storage medium 830 communicatively coupled to the processor 828. The processor 828 may include one central processing unit or may be distributed across one or more processors in one or more locations. Examples of a non-transitory computer readable storage medium 830 include random-access memory (RAM) devices, read-only memory (ROM) devices, optical devices (e.g., CDs or DVDs), disk drives, and the like. The non-transitory computer readable storage medium 830 may store computer readable program code that may be executed by the processor 828 to process and analyze the measurement data generated by fluid analysis system 804, adjust the parameters of the fluid monitoring and handling system 800, and/or operate a part or whole of the fluid monitoring and handling system 800. Further, from the rheological measurements of the drilling fluid measured by the fluid analysis system 804 while an electric field is applied, the program code may be executed by the processor 828 to determine concentration of one or more drilling fluid additives in the drilling fluid. The concentration may be determined, for example, using a correlation developed using electro-rheology. For example, the concentration may be determined using a correlation between a rate of change of at least one rheological property as a function of at least one property of the electric field as described above with respect to FIGS. 1-6.

The computer system 824 may further include one or more input/output ("I/O") interface(s) 832 communicatively coupled to the processor 828. The I/O interface(s) 832 may be any suitable system for connecting the computer system 824 to a communication link, such as a direct connection, a private network, a virtual private network, a local area network, a wide area network ("WAN"), a wireless communication system, or combinations thereof; a storage device, such as storage 834; an external device, such as a keyboard, a monitor, a printer, a voice recognition device, or a mouse; or any other suitable system. The storage 834 may store data required by the fluid analysis system 804 for performing fluid analysis. For instance, the storage 834 may store a collection of equivalent circuit models that may be used during the EIS analysis. The storage 834 may be or include compact disc drives, floppy drives, hard disks, flash memory, solid-state drives, and the like. Those of ordinary skill in the art will appreciate that suitable data processing systems may include additional, fewer, and/or different components than those described for computer system 824.

Data processing and analysis software native to the fluid analysis system 804 and/or installed on the computer system 824 may be used to analyze the data generated by fluid analysis system 804. This procedure may be automated such that the analysis happens without the need for operator input or control. Further, the operator may select from several previously input parameters or may be able to recall previously measured data. Any of the data may be transferred and/or stored on an external memory device (e.g., a USB drive), if desired.

With continued reference to FIG. 8, the drilling fluid may delivered to a wellbore from mud pit 802 by way of mud pump 816 via wellbore line 814. The mud pump 816 may be any type of pump or pumping system useful for circulating a drilling fluid into a subterranean formation under a sufficient pressure. The drilling fluid that has been circulated within the wellbore may be returned to the mud pit 802 via a circulated drilling fluid return line 836 and provided to a fluid reconditioning system 822 to condition the circulated drilling fluid prior to returning it to the mud pit 802. The fluid reconditioning system 822 may be or include one or more of a shaker (e.g., shale shaker), a centrifuge, a hydrocyclone, a separator (including magnetic and electrical separators), a desilter, a desander, a separator, a filter (e.g., diatomaceous earth filters), a heat exchanger, and any fluid reclamation equipment. The fluid reconditioning system 822 may further include one or more sensors, gauges, pumps, compressors, and the like used to monitor, regulate, and/or recondition the drilling fluid and various additives added thereto. After the drilling fluid has been reconditioned, the drilling fluid may be returned to the mud pit 802 via the reconditioned fluid line.

FIG. 9 illustrates an example of a drilling system 900 that may employ the fluid monitoring and handling system 800 of FIG. 8 described herein to determine ASG. It should be noted that while FIG. 9 generally depicts a land-based drilling system, those skilled in the art will readily recognize that the principles described herein are equally applicable to subsea drilling operations that employ floating or sea-based platforms and rigs, without departing from the scope of the disclosure.

As illustrated, the drilling system 900 may include a drilling platform 904 that supports a derrick 906 having a traveling block 908 for raising and lowering a drill string 910. The drill string 910 may include, but is not limited to, drill pipe and coiled tubing, as generally known to those skilled in the art. A kelly 912 may support the drill string 910 as it may be lowered through a rotary table 914. A drill bit 916 may be attached to the distal end of the drill string 910 and may be driven either by a downhole motor and/or via rotation of the drill string 910 from the well surface. Without limitation, the drill bit 916 may include, roller cone bits, PDC bits, natural diamond bits, any hole openers, reamers, coring bits, and the like. As the drill bit 916 rotates, it may create a wellbore 918 that penetrates various subterranean formations 920.

The drilling system 900 may further include the fluid monitoring and handling system 800 as generally described herein. The mud pump 816 of the fluid monitoring and handling system 800 representatively includes any conduits, pipelines, trucks, tubulars, and/or pipes used to fluidically convey the drilling fluid 922 downhole, any pumps, compressors, or motors (e.g., topside or downhole) used to drive the drilling fluid 922 into motion, any valves or related joints used to regulate the pressure or flow rate of the drilling fluid 922, and any sensors (e.g., pressure, temperature, flow rate, etc.), gauges, and/or combinations thereof, and the like.

The mud pump 816 may circulate may circulate the drilling fluid 922 through a feed pipe 924 and to the kelly 912, which conveys the drilling fluid 922 downhole through the interior of the drill string 910 and through one or more orifices in the drill bit 916. The drilling fluid 922 may then be circulated back to the surface via an annulus 926 defined between the drill string 910 and the walls of the wellbore 918. At the surface, the recirculated or spent drilling fluid 922 may be conveyed to the fluid reconditioning system 850 via a circulated drilling fluid return line 836. After passing through the fluid reconditioning system 850, a "cleaned" drilling fluid 922 may be deposited into a nearby mud pit 802. While illustrated as being arranged at the outlet of the wellbore 918 via the annulus 926, those skilled in the art will readily appreciate that the fluid reconditioning system 850 may be arranged at any other location in the drilling system 900 to facilitate its proper function, without departing from the scope of the scope of the disclosure.

Referring still to FIG. 9, the fluid monitoring and handling system 800 may further include the fluid analysis system 804, which may be disposed on a skid supported on the drilling platform 904. The fluid analysis system 804 may, for example, continuously or intermittently measure the impedance of the drilling fluid 922. As illustrated, the drilling fluid 922 may be taken from the mud pit 802 via the mud pit line 806 and an analyzed drilling fluid may be returned to the mud pit 802 via the return line 808. Alternatively, the impedance of the drilling fluid 922 may be measured, recorded, and/or analyzed at fluid reconditioning system 822, or at any other suitable location, such as in feed pipe 924 or in drilling fluid return line 836 or even while in the wellbore 918 if desired.

Thus, the fluid monitoring and handling system 800 may advantageously monitor the concentration of one or more drilling fluid additives using the example method disclosed herein. The fluid monitoring and handling system 800 may also generate automatic warnings to the personnel when the concentrations deviate from preset safety margins and/or automatically add additional amounts of the one or more drilling fluid additives to the drilling fluid when the concentrations deviate from preset safety margins.

Accordingly, this disclosure describes systems and methods that use electrochemical impedance spectroscopy for average specific gravity of solids in drilling fluids Without limitation, the systems and methods may further be characterized by one or more of the following statements:

Statement 1: A method for drilling a wellbore may include circulating a drilling fluid in a wellbore. The method may further include extending the wellbore into one or more subterranean formations. The method may further include measuring impedance of at least a portion of the drilling fluid. The method may further include determining one or more model elements of an equivalent circuit model for modeling frequency responses of the drilling fluid from the impedance. The method may further include determining an estimate of average specific gravity of solids in the drilling fluid based, at least partially, on the one or more model elements.

Statement 2: The method of statement 1, wherein the measuring the impedance of the portion of the drilling fluid may include placing the portion of the drilling fluid in a container and applying an alternating current signal to the portion in the container.

Statement 3: The method of statement 2, wherein the container may include a pair of plates, the alternating current signal may be received at one of the plates and may be injected into the portion from another one of the plates.

Statement 4: The method of any preceding claim, wherein the measuring the impedance of the portion of the drilling fluid may include measuring the impedance in a flow line.

Statement 5: The method of statement 4, wherein the impedance of the portion of the drilling fluid may be continuously measured in the flow line.

Statement 6: The method of any preceding statement, wherein the impedance of the portion of the drilling fluid may be measured in a drilling fluid return and the impedance may be measured in a feed pipe to the wellbore.

Statement 7: The method of any preceding statement, wherein the equivalent circuit model may include a first capacitor C1, a second capacitor C2, a resistor R1, a first constant phase element CPE1, and a second constant phase element CPE2, and wherein an equivalent circuit impedance ($Z_{eq}$) may be given by:

$$Z_{eq}(\omega) = Z_{CPE1}(\omega) + \frac{Z_{R1}Z_{C1}(\omega)(Z_{C2}(\omega) + Z_{CPE2}(\omega))}{Z_{C1}(\omega)(Z_{C2}(\omega) + Z_{CPE2}(\omega)) + Z_{R1}(Z_{C1}(\omega) + Z_{C2}(\omega) + Z_{CPE2}(\omega))}$$

Wherein $Z_{C1}$, $Z_{C2}$, $Z_{R1}$, $Z_{CPE1}$, $Z_{CPE2}$ represent impedances of the first capacitor C1, the second capacitor, C2, the resistor R1, the first constant phase element CPE1, and the second constant phase element CPE2, respectively.

Statement 8: The method of any preceding statement, wherein the determining the estimate of average specific gravity of solids in the drilling fluid may use a correlation between the one or more model elements and average specific gravity.

Statement 9: The method of any preceding statement, further including: generating frequency responses for two or more sample drilling fluids having a known concentration of one or more solid components after application of a direct current electric field, calculating an equivalent impedance of the equivalent circuit model for modeling the frequency responses of the two or more sample drilling fluids, the equivalent circuit model including one or more model elements, and generating a correlation between the one or more model elements and the known concentration of the one or more solid components.

Statement 10: A method for analyzing a drilling fluid may include generating frequency responses of two or more sample drilling fluids having known concentrations of one or more solid components after application of a direct current electric field to each of the two or more sample drilling fluids. The method may further include selecting an equivalent circuit model including one or more model elements for modeling the frequency responses. The method may further include calculating an equivalent impedance of the equivalent circuit model. The method may further include generating a correlation between the one or more model elements and the known concentrations of the one or more solid components.

Statement 11: The method of statement 10 may further include measuring an impedance of at least a portion of an additional drilling fluid, and determining an estimate of average specific gravity of solids in the additional drilling fluid based, at least partially, on the correlation.

Statement 12: The method of statement 10 or 11, wherein the equivalent circuit model may include a first capacitor C1, a second capacitor C2, a resistor R1, a first constant phase element CPE1, and a second constant phase element CPE2, and wherein an equivalent circuit impedance ($Z_{eq}$) may be given by:

$$Z_{eq}(\omega) = Z_{CPE1}(\omega) + \frac{Z_{R1}Z_{C1}(\omega)(Z_{C2}(\omega) + Z_{CPE2}(\omega))}{Z_{C1}(\omega)(Z_{C2}(\omega) + Z_{CPE2}(\omega)) + Z_{R1}(Z_{C1}(\omega) + Z_{C2}(\omega) + Z_{CPE2}(\omega))}$$

Wherein $Z_{C1}$, $Z_{C2}$, $Z_{R1}$, $Z_{CPE1}$, $Z_{CPE2}$ represent impedances of the first capacitor C1, the second capacitor, C2, the resistor R1, the first constant phase element CPE1, and the second constant phase element CPE2, respectively.

Statement 13: The method of any one of statements 10 to 12 may further include: placing at least one of the sample drilling fluids in a container, applying the direct current electric field to the at least one of the sample drilling fluids in the container, applying an alternating current electric field to the at least one of the sample drilling fluids in the container, and measuring frequency response of the at least one of the sample drilling fluids in the container while applying the alternating current electric field.

Statement 14: The method of statement 13, wherein the direct current electric field may be at a constant voltage.

Statement 15: The method of statement 13, wherein the direct current electric field may be applied for a period of time ranging from about 10 seconds to about 8 hours.

Statement 16: The method of statement 13, wherein the applying the alternating current electric field may include applying a frequency sweep ranging from about to Hertz to about 500 KiloHertz.

Statement 17: A drilling system that may include a drilling statement. The drilling system may further include a drill bit attached to a distal end of the drill string. The drilling system may further include a fluid monitoring and handling system that may include a mud pit operable to receive a drilling fluid from a wellbore. The fluid monitoring and handling system may further include a mud pump operable to circulate the drilling fluid. The fluid monitoring and handling system an electrochemical impedance spectroscopy system may include one or more electrochemical impedance spectroscopy probes for measuring impedance of at least a portion of the drilling fluid. The fluid monitoring and handling system may further include a computer system in signal communication with the electrochemical impedance spectroscopy system, wherein the computer system may include a processor and a non-transitory computer readable storage medium that when executed by the processor may cause the computer system to determine an estimate of average specific gravity of solids in the drilling fluid based, at least partially, on the impedance.

Statement 18: The drilling system of claim 17, wherein the electrochemical impedance spectroscopy system may include a container for holding a sample of the drilling fluid and a pair of electrodes disposed in the container.

Statement 19: The drilling system of claim 17 or claim 18, wherein at least one of the electrochemical impedance spectroscopy probes may be disposed in a flow line.

Statement 20: The drilling system of any one of claims 17 to 19, wherein one of the at least one electrochemical impedance spectroscopy probes may be in a drilling fluid return line, and wherein another one of the at least one electrochemical impedance spectroscopy probes may be in a feed pipe to a wellbore.

The preceding description provides various embodiments of the systems and methods of use disclosed herein which may contain different method steps and alternative combinations of components. It should be understood that, although individual embodiments may be discussed herein, the present disclosure covers all combinations of the disclosed embodiments, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present embodiments are well adapted to attain the ends and advantages mentioned as well as those that are inherent therein. The particular embodiments disclosed above are illustrative only, and may be modified and practiced in different but equivalent manners apparent to those skilled in the art having the benefit of the teachings herein. Although individual embodiments are discussed, the disclosure covers all combinations of all of the embodiments. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative embodiments disclosed above may be altered or modified and all such variations are considered within the scope and spirit of those embodiments. If there is any conflict in the usages of a word or term in this specification and one or more patent(s) or other documents that may be incorporated herein by reference, the definitions that are consistent with this specification should be adopted.

What is claimed is:
1. A method for drilling a wellbore comprising:
circulating a drilling fluid in a wellbore;
extending the wellbore into one or more subterranean formations;
measuring impedance of at least a portion of the drilling fluid;
determining one or more model parameters of an equivalent circuit model for modeling frequency responses of the drilling fluid from the impedance; and
determining an estimate of average specific gravity of solids in the drilling fluid based, at least partially, on the one or more model parameters;
wherein the equivalent circuit model comprises a first capacitor C1, a second capacitor C2, a resistor R1, a first constant phase element CPE1, and a second constant phase element CPE2, and wherein an equivalent circuit impedance ($Z_{eq}$) is given by:

$$Z_{eq}(\omega) = Z_{CPE1}(\omega) + \frac{Z_{R1}Z_{C1}(\omega)(Z_{C2}(\omega) + Z_{CPE2}(\omega))}{Z_{C1}(\omega)(Z_{C2}(\omega) + Z_{CPE2}(\omega)) + Z_{R1}(Z_{C1}(\omega) + Z_{C2}(\omega) + Z_{CPE2}(\omega))}$$

wherein $Z_{C1}$, $Z_{C2}$, $Z_{R1}$, $Z_{CPE1}$, $Z_{CPE2}$ represent impedances of the first capacitor C1, the second capacitor, C2, the resistor R1, the first constant phase element CPE1, and the second constant phase element CPE2, respectively.

2. The method of claim 1, wherein the impedance of the portion of the drilling fluid is measured in a drilling fluid return and the impedance is measured in a feed pipe to the wellbore.

3. The method of claim 1, wherein the determining the estimate of average specific gravity of solids in the drilling fluid uses a correlation between the one or more model parameters and average specific gravity.

4. The method of claim 1, further comprising generating frequency responses for two or more sample drilling fluids having a known concentration of one or more solid components after application of a direct current electric field, calculating an equivalent impedance of the equivalent circuit model for modeling the frequency responses of the two or more sample drilling fluids, the equivalent circuit model comprising one or more model elements, and generating a correlation between the one or more model parameters and the known concentration of the one or more solid components.

5. The method of claim 1, wherein the measuring the impedance of the portion of the drilling fluid comprises placing the portion of the drilling fluid in a container and applying an alternating current signal to the portion in the container.

6. The method of claim 5, wherein the container comprises a pair of plates, the alternating current signal being received at one of the plates and injected into the portion from another one of the plates.

7. The method of claim 1, wherein the measuring the impedance of the portion of the drilling fluid comprises measuring the impedance in a flow line.

8. The method of claim 7, wherein the impedance of the portion of the drilling fluid is continuously measured in the flow line.

9. A method for analyzing a drilling fluid comprising:
generating frequency responses of two or more sample drilling fluids having known concentrations of one or more solid components after application of a direct current electric field to each of the two or more sample drilling fluids;
selecting an equivalent circuit model comprising one or more model elements for modeling the frequency responses;
calculating an equivalent impedance of the equivalent circuit model;
generating a correlation between one or more model parameters and the known concentrations of the one or more solid components; and
determining an estimate of an average specific gravity of solids based, at least partially, on the one or more model parameters and a measurement of impedance;
wherein the equivalent circuit model comprises a first capacitor C1, a second capacitor C2, a resistor R1, a first constant phase element CPE1, and a second constant phase element CPE2, and wherein an equivalent circuit impedance ($Z_{eq}$) is given by:

$$Z_{eq}(\omega) = Z_{CPE1}(\omega) + \frac{Z_{R1}Z_{C1}(\omega)(Z_{C2}(\omega) + Z_{CPE2}(\omega))}{Z_{C1}(\omega)(Z_{C2}(\omega) + Z_{CPE2}(\omega)) + Z_{R1}(Z_{C1}(\omega) + Z_{C2}(\omega) + Z_{CPE2}(\omega))}$$

wherein $Z_{C1}$, $Z_{C2}$, $Z_{R1}$, $Z_{CPE1}$, $Z_{CPE2}$ represent impedances of the first capacitor C1, the second capacitor, C2, the resistor R1, the first constant phase element CPE1, and the second constant phase element CPE2, respectively.

10. The method of claim 9, further comprising measuring an impedance of at least a portion of an additional drilling fluid, and determining an estimate of an average specific gravity of solids in the additional drilling fluid based, at least partially, on the correlation.

11. The method of claim 9, further comprising placing at least one of the sample drilling fluids in a container, applying the direct current electric field to the at least one of the sample drilling fluids in the container, applying an alternating current electric field to the at least one of the sample drilling fluids in the container, and measuring frequency response of the at least one of the sample drilling fluids in the container while applying the alternating current electric field.

12. The method of claim 11, wherein the direct current electric field is at a constant voltage.

13. The method of claim 11, wherein the direct current electric field is applied for a period of time ranging from about 10 seconds to about 8 hours.

14. The method of claim 11, wherein the applying the alternating current electric field comprises applying a frequency sweep ranging from about to Hertz to about 500 KiloHertz.

15. A drilling system comprising:
a drill string;
a drill bit attached to a distal end of the drill string;
a fluid monitoring and handling system comprising:
a mud pit operable to receive a drilling fluid from a wellbore;
a mud pump operable to circulate the drilling fluid;
an electrochemical impedance spectroscopy system comprising one or more electrochemical impedance spectroscopy probes for measuring impedance of at least a portion of the drilling fluid; and
a computer system in signal communication with the electrochemical impedance spectroscopy system, wherein the computer system comprises a processor and a non-transitory computer readable storage medium that when executed by the processor causes the computer system to determine an estimate of average specific gravity of solids in the drilling fluid based, at least partially, on the impedance by determining one or more model parameters of an equivalent circuit model for modeling frequency responses of the drilling fluid from the impedance; and determining an estimate of average specific gravity of solids in the drilling fluid based, at least partially, on the one or more model parameters,
wherein the equivalent circuit model comprises a first capacitor C1, a second capacitor C2, a resistor R1, a first constant phase element CPE1, and a second constant phase element CPE2, and wherein an equivalent circuit impedance ($Z_{eq}$) is given by:

$$Z_{eq}(\omega) = Z_{CPE1}(\omega) + \frac{Z_{R1}Z_{C1}(\omega)(Z_{C2}(\omega) + Z_{CPE2}(\omega))}{Z_{C1}(\omega)(Z_{C2}(\omega) + Z_{CPE2}(\omega)) + Z_{R1}(Z_{C1}(\omega) + Z_{C2}(\omega) + Z_{CPE2}(\omega))}$$

wherein $Z_{C1}$, $Z_{C2}$, $Z_{R1}$, $Z_{CPE1}$, $Z_{CPE2}$ represent impedances of the first capacitor C1, the second capacitor, C2, the resistor R1, the first constant phase element CPE1, and the second constant phase element CPE2, respectively.

16. The drilling system of claim 15, wherein the electrochemical impedance spectroscopy system comprises a container for holding a sample of the drilling fluid and a pair of electrodes disposed in the container.

17. The drilling system of claim 15, wherein at least one of the electrochemical impedance spectroscopy probes is disposed in a flow line.

18. The drilling system of claim 15, wherein one of the at least one electrochemical impedance spectroscopy probes is in a drilling fluid return line, and wherein another one of the at least one electrochemical impedance spectroscopy probes is in a feed pipe to a wellbore.

19. A method for drilling a wellbore comprising:
circulating a drilling fluid in a wellbore;
extending the wellbore into one or more subterranean formations;
measuring impedance of at least a portion of the drilling fluid;
determining one or more model parameters of an equivalent circuit model for modeling frequency responses of the drilling fluid from the impedance; and
determining an estimate of average specific gravity of solids in the drilling fluid based, at least partially, on the one or more model parameters,
wherein the equivalent circuit model comprises a first capacitor C1, a second capacitor C2, a resistor R1, a first constant phase element CPE1, and a second constant phase element CPE2, and wherein an equivalent circuit impedance ($Z_{eq}$) is given by:

$$Z_{eq}(\omega) = Z_{CPE1}(\omega) + \frac{Z_{R1}Z_{C1}(\omega)(Z_{C2}(\omega) + Z_{CPE2}(\omega))}{Z_{C1}(\omega)(Z_{C2}(\omega) + Z_{CPE2}(\omega)) + Z_{R1}(Z_{C1}(\omega) + Z_{C2}(\omega) + Z_{CPE2}(\omega))}$$

wherein $Z_{C1}$, $Z_{C2}$, $Z_{R1}$, $Z_{CPE1}$, $Z_{CPE2}$ represent impedances of the first capacitor C1, the second capacitor, C2, the resistor R1, the first constant phase element CPE1, and the second constant phase element CPE2, respectively;

wherein the determining the estimate of average specific gravity of solids in the drilling fluid uses a correlation between the one or more model parameters and average specific gravity and wherein the impedance of the portion of the drilling fluid is measured in a drilling fluid return and the impedance is measured in a feed pipe to the wellbore.

20. A method for analyzing a drilling fluid comprising:
generating frequency responses of two or more sample drilling fluids having known concentrations of one or more solid components after application of a direct current electric field to each of the two or more sample drilling fluids;
selecting an equivalent circuit model comprising one or more model elements for modeling the frequency responses;
calculating an equivalent impedance of the equivalent circuit model;
generating a correlation between one or more model parameters and the known concentrations of the one or more solid components; and
determining an estimate of an average specific gravity of solids based, at least partially, on the one or more model parameters and a measurement of impedance,
wherein the equivalent circuit model comprises a first capacitor C1, a second capacitor C2, a resistor R1, a first constant phase element CPE1, and a second constant phase element CPE2, and wherein an equivalent circuit impedance ($Z_{eq}$) is given by:

$$Z_{eq}(\omega) = Z_{CPE1}(\omega) + \frac{Z_{R1}Z_{C1}(\omega)(Z_{C2}(\omega) + Z_{CPE2}(\omega))}{Z_{C1}(\omega)(Z_{C2}(\omega) + Z_{CPE2}(\omega)) + Z_{R1}(Z_{C1}(\omega) + Z_{C2}(\omega) + Z_{CPE2}(\omega))}$$

wherein $Z_{C1}$, $Z_{C2}$, $Z_{R1}$, $Z_{CPE1}$, $Z_{CPE2}$ represent impedances of the first capacitor C1, the second capacitor, C2, the resistor R1, the first constant phase element CPE1, and the second constant phase element CPE2, respectively;
wherein the direct current electric field is at a constant voltage and wherein the direct current electric field is applied for a period of time ranging from about 10 seconds to about 8 hours.

* * * * *